United States Patent [19]

Murai et al.

[11] Patent Number: 5,757,019
[45] Date of Patent: May 26, 1998

[54] PATTERN DRAWING APPARATUS

[75] Inventors: Shiaki Murai; Kazuaki Yamamoto, both of Tokyo-To, Japan

[73] Assignee: Dai Nippon Printing Co., Ltd., Japan

[21] Appl. No.: 611,772

[22] Filed: Mar. 6, 1996

[30] Foreign Application Priority Data

Mar. 7, 1995 [JP] Japan ..................... 7-072488

[51] Int. Cl.⁶ ............................................. H01J 37/302
[52] U.S. Cl. ...................... 250/479.22; 250/492.2
[58] Field of Search ................ 250/398, 492.22, 250/492.2

[56] References Cited

U.S. PATENT DOCUMENTS

| | | | |
|---|---|---|---|
| 4,267,456 | 5/1981 | Hidai et al. | 250/398 |
| 4,511,980 | 4/1985 | Watanabe | 250/398 |
| 4,531,191 | 7/1985 | Koyama | 250/492.22 |
| 4,837,447 | 6/1989 | Pierce et al. | 250/492.22 |
| 4,937,458 | 6/1990 | Fujikura | 250/398 |

*Primary Examiner*—Bruce Anderson
*Attorney, Agent, or Firm*—Parkhurst & Wendel

[57] ABSTRACT

A pattern drawing apparatus is provided. This apparatus draws a pattern on an object by irradiating the object with an electron beam. A pattern data corresponding to the pattern to be drawn is stored in a memory. The pattern data is sent to a controller that controls irradiation of the electron beam to the object. Check is made whether the controller correctly controls the irradiation of the electron beam in accordance with the stored pattern data. Another memory stores the pattern data per a predetermined number of bits included in the pattern data. The bit data is sent to the controller that generates high and low voltages to control the irradiation of the electron beam. A counter counts the numbers of bits and high or low voltages. A comparator compares the counted numbers of bits and voltages. The comparison results are sent to an indicator that indicates an error when the counted numbers are different from each other. The counted numbers themselves may be indicated. Instead of the comparator, an exclusive-OR circuit may be provided. The bits of the pattern data are exclusive-ORed with the voltages expressed as bits. The output of the exclusive-OR circuit may be indicated as a bit map. Further, the bits of the pattern data and the voltages also may be indicated as bit maps.

7 Claims, 4 Drawing Sheets

PATTERN DRAWING APPARATUS

BACKGROUND OF THE INVENTION

1. Field of the Invention

The present invention relates to a pattern drawing apparatus. More specifically, this invention relates to a pattern drawing apparatus using an electron beam for forming a photomask used to manufacture various semiconductor devices (e.g., IC, LSI, etc.). Such a pattern drawing apparatus may form a pattern directly on a semiconductor substrate.

2. Description of the Prior Art

Conventionally, a raster type electron beam apparatus, such as the apparatus shown in FIG. 1, has been used to draw a pattern of a photomask used for manufacturing semiconductor devices. Further, the conventional apparatus has been used to draw a pattern directly on a semiconductor substrate.

In FIG. 1, a photomask substrate (photomask blank) 305 with a resist layer on the upper side is fed to a stage 306 from an automatic feeder 307. The stage 306 is movably placed on a vibration prevention frame 308. A power source 309 supplies voltages to an electron gun 300, an electromagnetic lens 302, a blanking electrode 303, and a deflecting electrode 304. The electron gun 300 emits an electron beam 301. The emitted electron beam 301 is focused on a resist layer on the photomask blank 305. The electron beam 301 scans the resist layer on the photomask blank under control of the electromagnetic lens 302, the blanking electrode 303, and the deflecting electrode 304.

Pattern drawing data and control data are fed from a magnetic disk 317 or a magnetic tape 318 to a CPU 315. These data are sent to a controller 311 and a memory 310. The data of the memory 310 is fed to the controller 311. The controller 311 then controls the electrodes 303 and 304 according to the data. Further, the controller 311 drives a motor 314 to move the stage 306. Any interference caused by the electron beam 301 is detected by a laser interferometer 313 and sent to the controller 311. An operator manipulates the electron beam apparatus through operation panel 312 while observing the semiconductor substrate 305 on a console CRT 316.

The electron beam apparatus is provided with a blanking control section with the blanking electrode 303 that controls irradiation of the electron beam to the photomask blank. It is called a blanking operation to irradiate the electron beam onto the photomask blank at its predetermined positions and not to irradiate the electron beam at its other positions according to a photoresist pattern to be made.

The blanking operation will be described in more detail hereinbelow with reference to FIGS. 2A and 2B. These figures show blanking operational principle of the raster type electron beam apparatus of FIG. 1.

In FIG. 2A, the photomask blank 305 is placed on the movable stage 306. The electron beam 301 is emitted from the electron gun 300 (FIG. 1) and irradiated onto the photomask blank through the blanking electrode 303 and the deflecting electrode 304.

As shown in FIG. 2A, a pattern required to be drawn is previously stored in the memory 310 (FIG. 1) in the form of a bit map. In this bit map, bits "1" indicate that a blanking voltage is applied to the blanking electrode 303. The electron beam 301 is thus blanked (blanking-on) and therefore the resist layer on the photomask blank 305 is not irradiated with the electron beam 301. On the other hand, bits "0" of the bit map indicate that the blanking voltage is not applied to the blanking electrode 303. The electron beam 301 is thus not blanked (blanking-off) and therefore the resist layer on the photomask blank 305 is irradiated with the electron beam 301.

As described, the blanking electrode 303 is activated or deactivated in accordance with the bit map data "1" and "0" of the memory 310. The bit data in the dot line box of the memory 310 is for one scanning. The electron beam 301 is irradiated onto the resist layer on the photomask blank 305 by the deflecting electrode 304 for one scanning in a direction depicted by an arrow X. This beam deflection is governed by the bit data of the memory 310 for one scanning via blanking electrode 303. The blanking and deflection operations are conducted while the stage 306 is moving in the direction depicted by the arrow X and also in a direction depicted by an arrow Y.

Under these operations, the resist layer on the photomask blank 305 is patterned with a latent image as shown in FIG. 2B according to the bit map data of the memory 310. In FIG. 2B, black circles depict that the electron beam 301 reached there. On the other hand, white circles depict that the electron beam 301 did not reach there. The circles in the dot box of FIG. 2B corresponds to the data in the dot box of the memory 310 in FIG. 2A for one scanning.

This raster type electron beam apparatus requires an accurate blanking operation in accordance with the bit map data in order to draw a correct pattern on the resist layer on the photomask blank.

In practice, however, there exists such a case where the blanking operation is not performed accurately in accordance with the dot map data due to the presence of noise. On the other hand, during the photomask manufacturing process, a long time is inevitably required for the pattern drawing process, for the photomask forming process, and for the photomask inspection process (to inspect the presence or absence of defects of the formed pattern).

Therefore, there exists a serious problem in that it takes a long time to detect a defective pattern caused by a defective blanking operation.

SUMMARY OF THE INVENTION

With these problems in mind, therefore, it is an object of the present invention to provide a pattern drawing apparatus that finds a defective blanking operation immediately.

To achieve the above-mentioned object, the present invention provides an apparatus for drawing a pattern on an object by irradiating the object with an electron beam, comprising: a memory for storing pattern data corresponding to the pattern to be drawn; a controller for controlling irradiation of the electron beam to the object in accordance with the stored pattern data; and means for checking whether the controller correctly controls the irradiation of the electron beam in accordance with the stored pattern data.

The checking means may include a memory for storing the pattern data per a predetermined number of bits included in the pattern data, each predetermined number of bits being sent to the controller that generates a predetermined number of high and low voltages to control the irradiation of the electron beam.

The checking means may further include a counter for counting the number of bits and the number of high or low voltages.

The checking means may further include a comparator for comparing the counted numbers of bits and voltages.

The checking means may further include an indicator for indicating an error when the counted numbers are different from each other.

The checking means may further include an indicator for indicating the counted numbers.

The checking means may further include a memory for storing the high and low voltages as bits.

The checking means may further include an exclusive-OR circuit for exclusive-ORing the bits of the pattern data with the bits of the voltages.

The checking means may further include an indicator for indicating the output of the exclusive-OR circuit as a bit map.

The checking means may further include an indicator for indicating bits of the pattern data and the voltages as bit maps.

DETAILED DESCRIPTION OF THE PREFERRED EMBODIMENTS

A first embodiment of the pattern drawing apparatus according to the present invention will be described hereinbelow with reference FIG. 3.

Figure 1:
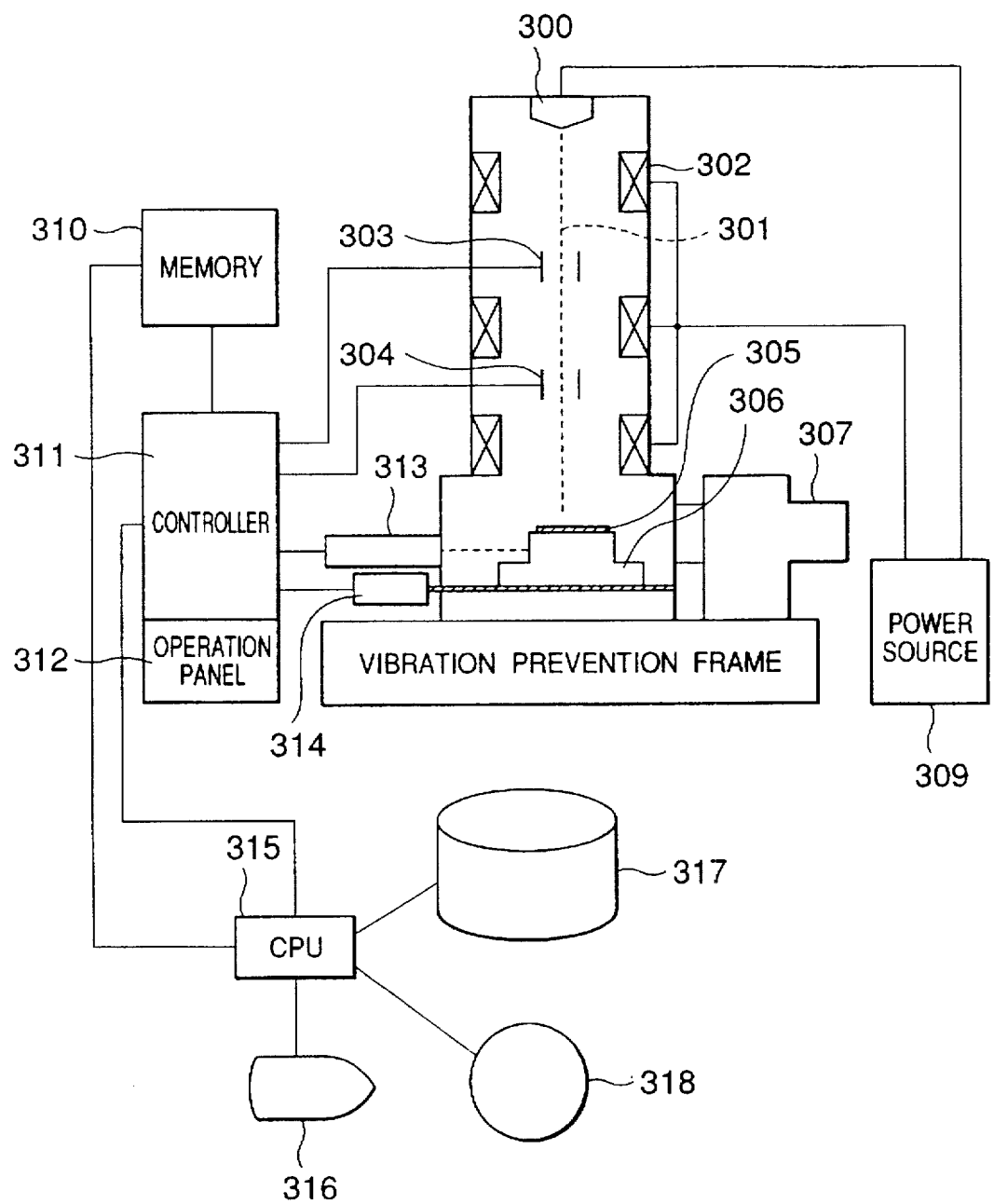
FIG. 1 shows is a conventional raster scanning type electron beam apparatus.
Figure 2A:
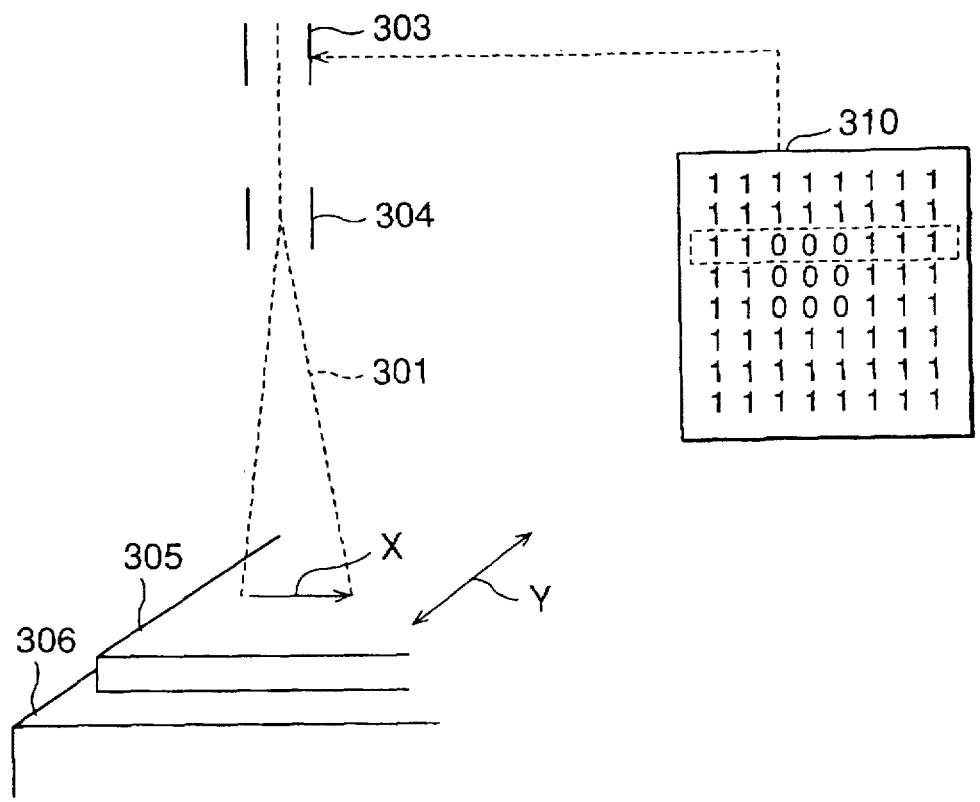
FIG. 2A is a schematic block diagram of main portions of the conventional apparatus of FIG. 1.
Figure 2B:
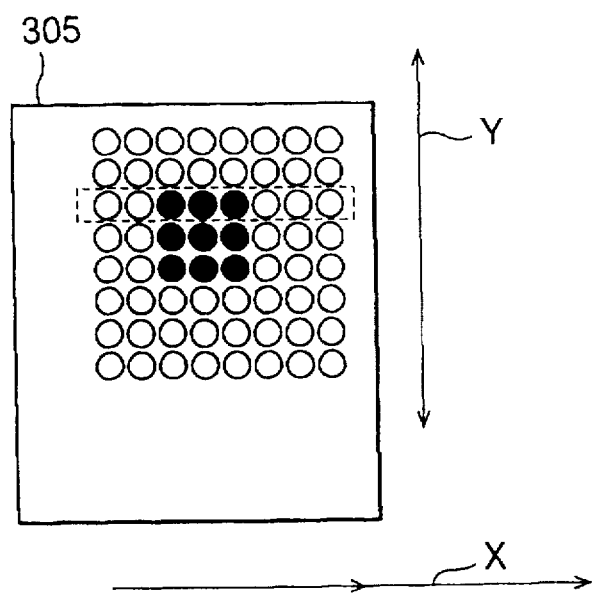
FIG. 2B is an illustration for assistance in explaining the pattern made on a resist layer on a photomask blank.
Figure 3:
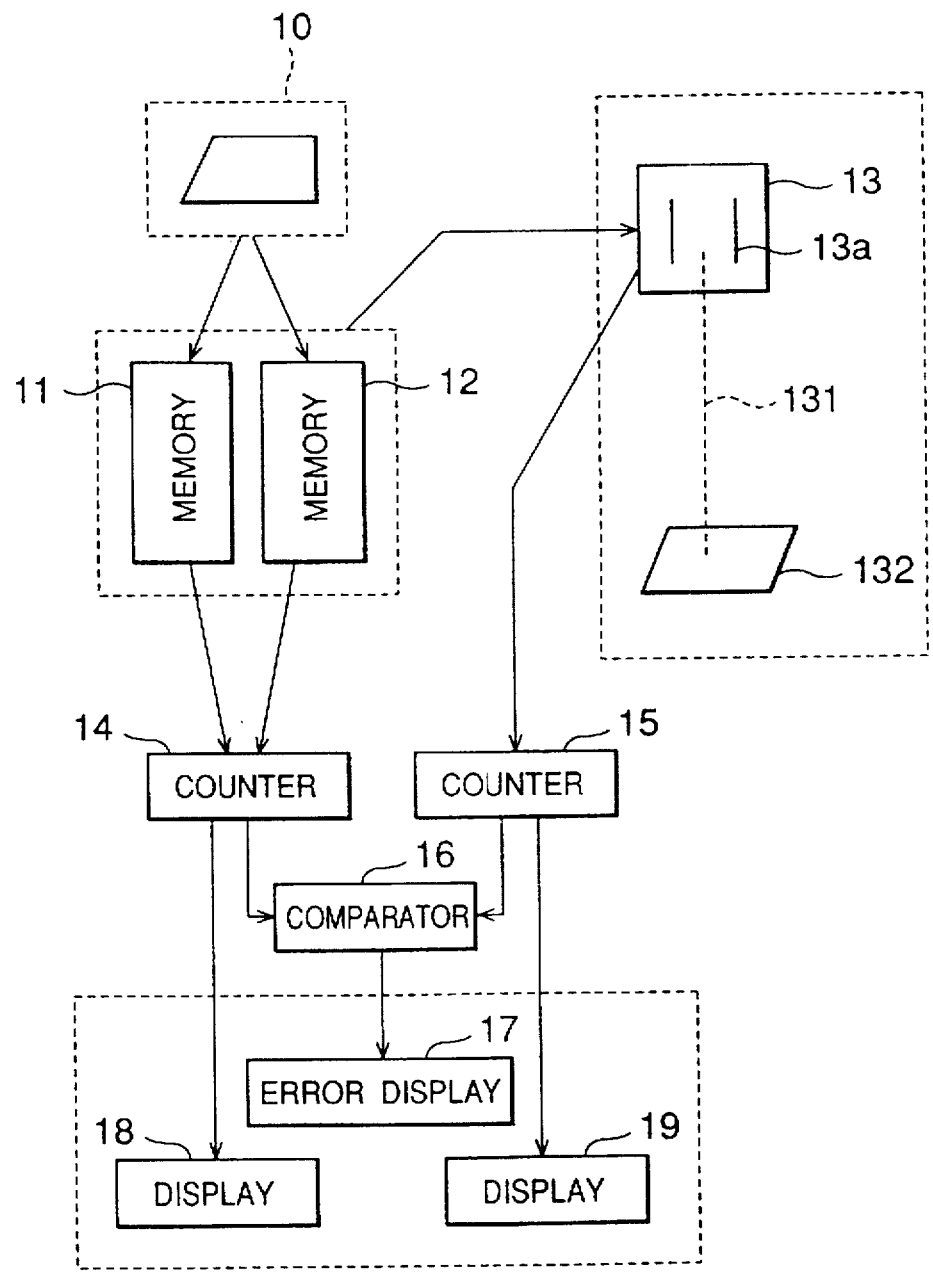
FIG. 3 is a block diagram of main portions of a first embodiment of the pattern drawing apparatus according to the present invention.

FIG. 3 shows main components of the pattern drawing apparatus concerning the blanking operations. Other portions of the apparatus not shown are the same as those of the conventional raster type electron beam apparatus of FIG. 1.

As shown in FIG. 3, a memory 10 previously stores data (e.g. a trapezoidal shape data). Each trapezoidal shape data bits is for a predetermined area of a resist layer on a photomask blank 132 to be patterned using an electron beam 131. The data are stored in memories 11 or 12 so as to be developed in the form of a bit map.

Each data stored in the memories 11 or 12 is sent to a blanking operation section 13. Blanking is turned on in response to bits "1" in the data. The blanking operation is performed using a blanking electrode 13a. The blanking electrode 13a works so that the electron beam 131 is not irradiated upon the resist layer on the photomask blank 132. On the other hand, blanking is turned off in response to bits "0" in the data. The blanking operation section 13 does not generate any blanking voltage. The blanking electrode 13a does not work, so that the electron beam 131 is irradiated upon the resist layer on the photomask blank 132 to form a pattern.

Each data stored in the memories 11 or 12 is sent to a counter 14. The counter 14 counts the number of bits "1" for turning on the blanking operation. Further, the blanking voltages applied to the blanking electrode 13a are sent to a counter 15. The counter 15 counts the number of blanking voltages actually applied to the blanking electrode 13a.

The counted numbers are sent to a comparator 16. The comparator 16 compares the numbers counted by the counters 14 and 15. This comparison is made after a predetermined number of pattern drawings on the resist on the photomask blank 132 on the basis of the data stored in the memories 11 or 12. When there exists a difference between the counted numbers, the comparator 16 judges that there is a defective blanking operation and sends an error signal to an error display section 17. The error display section 17 indicates the defective blanking operation. The numbers counted by the counter 14 and 15 are also sent to display sections 18 and 19, respectively. The display sections 18 and 19 display the numbers counted by the counters 14 15, respectively.

As described above, whenever the resist layer on the photomask blank 132 is patterned in accordance with a predetermined amount of data, it is possible to confirm the presence or the absence of the defective blanking operation.

A second embodiment of the pattern drawing apparatus according to the present invention will be described hereinbelow with reference to FIG. 4.

Figure 4:
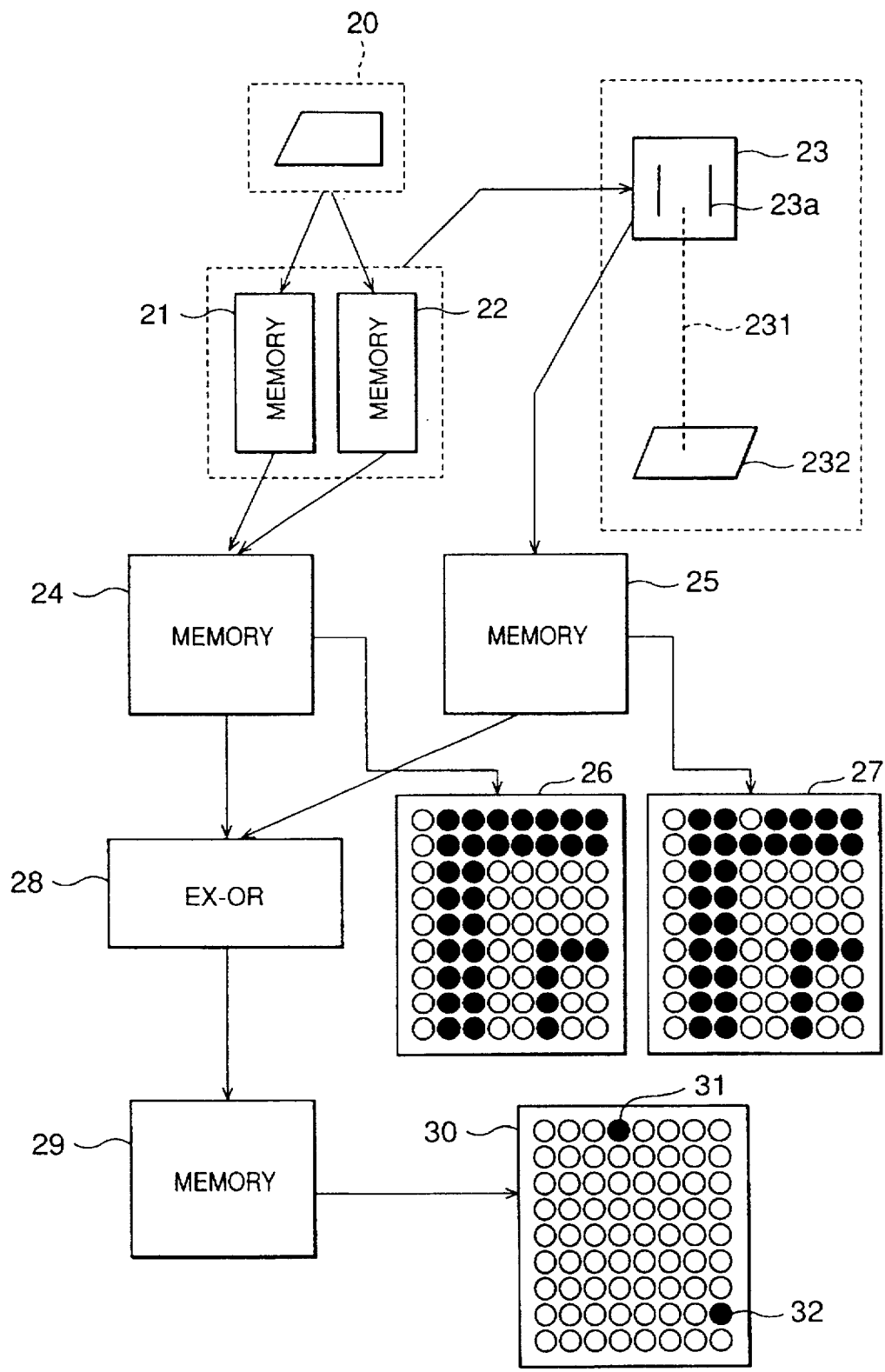
FIG. 4 is a block diagram of main portions of a second embodiment of the pattern drawing apparatus according to the present invention.

FIG. 4 shows main components of the pattern drawing apparatus concerning the blanking operations. Other portions of the apparatus not shown are the same as those of the conventional raster type electron beam apparatus of FIG. 1.

As shown in FIG. 4, a memory 20 previously stores data (e.g. a trapezoidal shape data). Each trapezoidal shape data is for a predetermined area of a resist layer on a photomask blank 232 to be patterned using an electron beam 231. The data are stored in memories 21 or 22 so as to be developed in the form of a bit map.

Each data stored in the memories 21 or 22 is sent to a blanking operation section 23. Blanking is turned on in response to bits "1" in the data. The blanking operation section 23 generates blanking voltages that are applied to a blanking electrode 23a. The blanking electrode 23a works so that the electron beam 231 is not irradiated upon the resist layer on the photomask blank 232. On the other hand, blanking is turned off in response to bits "0" in the data. The blanking operation section 23 does not generate any blanking voltage. The blanking electrode 23a does not work, so that the electron beam 231 is irradiated upon the resist layer on the photomask blank 232 to form a latent image pattern.

Each data stored in the memories 21 or 22 is sent to a memory 24. The memory 24 has a capacity of a bit map corresponding to predetermined times of data amount stored in the memories 21 or 22. Further, the blanking voltages applied to the blanking electrode 23a are sent to a memory 25. The blanking voltages, that is, blanking-on and -off, are stored in the memory 25 in the form of bit map data "1" and "0".

The data of the memories 24 and 25 are sent to a logic circuit 28 that has an exclusive-OR circuit. These data are exclusive-ORed for each bit. That is, these data are compared with each other for each bit. The comparison results are sent to a memory 29 that stores the results in the form of a bit map.

The bit map data of the memories 24 and 25 are sent to monitors 26 and 27, respectively. Each monitor displays the states of "1" and "0" in the bit map of the corresponding memory. In each monitor, black circles correspond to the data "0" and depict that the electron beam 231 reached there. On the other hand, white circles correspond to the data "1" and depict that the electron beam 53 did not reach there.

In FIG. 4, the monitor 26 displays the predetermined pattern to be made on the resist layer on the photomask blank 232. On the other hand, the monitor 27 displays the actual pattern that was made on the resist layer on the photomask 232. Further, the bit map data of the memory 29 are sent to a monitor 30. The monitor 30 displays only a position of bit "1" as black circles indicative of a mismatch between the bits stored in the memories 24 and 25.

As described above, only when defective blanking exists, the defective blanking positions are displayed on the monitor 30. Therefore, it is possible to easily check the defective blanking-on or -off positions by comparing the two monitor screens 26 and 27. Further, the monitor 30 displays a defective circle 31 that indicates a defective blanking-on position where blanking was erroneously on. The electron beam 231 thus erroneously did not reach there. The monitor 30 also displays a defective circle 32 as a defective blanking-off position where blanking was erroneously off. The electron beam 231 thus erroneously reached there.

As described above, according to the present invention, it is possible to provide the pattern drawing apparatus suitable for the raster scanning type electron beam apparatus, by which the defective blanking operation can be confirmed at an early stage of the pattern drawing process.

Further, in the pattern drawing apparatus according to the present invention, it is possible to confirm whether the defective blanking operation is the defective blanking-on (blanking voltage-on) operation or the defective blanking-off (blanking voltage-off) operation. Further, it is possible to confirm the defective positions on the pattern.

It is thus possible to confirm the defective blanking operation immediately, as compared with the conventional method such that the defective blanking operation can be confirmed only after the pattern has been drawn, processed, and inspected.

As a result, it is possible to decide whether the pattern drawing operation must be continued or interrupted at an early stage of the pattern forming process on the basis of the sorts of the defective blanking operation. The productivity thus can be improved markedly.

What is claimed is:

1. An apparatus for drawing a pattern on an object by irradiating the object with an electron beam, comprising:
   a memory for storing pattern data corresponding to the pattern to be drawn per a predetermined number of bits included in the pattern data;
   a controller, responsive to each one of said predetermined number of bits sent from the memory, for generating a predetermined number of high and low voltages to control irradiation of the electron beam to the object in accordance with the stored pattern data; and
   checking means for counting the number of bits and the number of high and low voltages to check whether the controller correctly controls the irradiation of the electron beam in accordance with the stored pattern data.

2. An apparatus according to claim 1, wherein the checking means comprises a comparator for comparing the counted numbers of bits and voltages.

3. An apparatus according to claim 2, wherein the checking means comprises an indicator for indicating an error when the counted numbers are different from each other.

4. An apparatus according to claim 1, wherein the checking means comprises an indicator for indicating the counted numbers.

5. An apparatus for drawing a pattern on an object by irradiating the object with an electron beam, comprising:
   a first memory for storing pattern data corresponding to the pattern to be drawn per a predetermined number of bits included in the pattern data;
   a controller, responsive to each one of said predetermined number of bits, for generating high and low voltages to control irradiation of the electron beam to the object in accordance with the stored pattern data;
   a second memory for storing the high and low voltages as bits; and
   checking means for exclusive-ORing the bits of the pattern data with the bits of the voltages to check whether the controller correctly controls the irradiation of the electron beam in accordance with the stored pattern data.

6. An apparatus according to claim 5, wherein the checking means comprises an indicator for indicating the output of the exclusive-OR circuit as a bit map.

7. An apparatus according to claim 5, wherein the checking means comprises an indicator for indicating bits of the pattern data and the voltages as bit maps.

* * * * *